US012592545B2

(12) United States Patent
Taku et al.

(10) Patent No.: US 12,592,545 B2
(45) Date of Patent: Mar. 31, 2026

(54) RIDGE TYPE SEMICONDUCTOR OPTICAL DEVICE

(71) Applicant: Lumentum Japan, Inc., Sagamihara (JP)

(72) Inventors: Sara Taku, Tokyo (JP); Takayuki Nakajima, Tokyo (JP); Masaru Onga, Sagamihara (JP); Shuhei Ono, Sagamihara (JP)

(73) Assignee: LumentumRadiant GmbH, Baar (CH)

( * ) Notice: Subject to any disclaimer, the term of this patent is extended or adjusted under 35 U.S.C. 154(b) by 136 days.

(21) Appl. No.: 17/653,747

(22) Filed: Mar. 7, 2022

(65) Prior Publication Data

US 2023/0119386 A1 Apr. 20, 2023

(30) Foreign Application Priority Data

Oct. 20, 2021 (JP) ................................ 2021-171722
Dec. 2, 2021 (JP) ................................ 2021-196286

(51) Int. Cl.
*H01S 5/22* (2006.01)
*H01S 5/042* (2006.01)
*H01S 5/34* (2006.01)

(52) U.S. Cl.
CPC ........ *H01S 5/2202* (2013.01); *H01S 5/04256* (2019.08); *H01S 5/3403* (2013.01); *H01S 2301/176* (2013.01)

(58) Field of Classification Search
CPC ............... H01S 5/2202; H01S 5/04256; H01S 5/22–2228; H01S 5/221–222; H01S 5/2201–2218
See application file for complete search history.

(56) References Cited

U.S. PATENT DOCUMENTS

| | | | | |
|---|---|---|---|---|
| 6,323,507 B1 * | 11/2001 | Yokoyama | .............. | H01S 5/227 |
| | | | | 372/49.01 |
| 6,639,241 B2 * | 10/2003 | Nakahara | .................. | H01S 5/22 |
| | | | | 257/14 |
| 7,675,954 B2 * | 3/2010 | Kadowaki | ........... | H01S 5/04254 |
| | | | | 372/87 |

(Continued)

FOREIGN PATENT DOCUMENTS

| | | |
|---|---|---|
| CN | 109412020 A | 3/2019 |
| JP | 2000216492 A | 8/2000 |

(Continued)

*Primary Examiner* — Tod T Van Roy
(74) *Attorney, Agent, or Firm* — Harrity & Harrity, LLP

(57) ABSTRACT

A device includes: a laminate including first and second regions adjacent to respective both sides of an isolation groove; a mesa stripe structure adjacent to the first region on the laminate and extending in the first direction; a bank structure adjacent to the second region on the laminate and extending in the first direction; and an electrode pattern. The isolation groove has an inner surface including a first wall surface adjacent to the first region, a second wall surface adjacent to the second region, and a bottom surface between the first and second regions. The ridge electrode extends from the side of the mesa stripe structure, along a second direction, toward the bank structure, and not beyond the second wall surface. The connection electrode is narrower in width in the first direction than any one of the ridge electrode and the pad electrode.

20 Claims, 6 Drawing Sheets

(56)         References Cited

U.S. PATENT DOCUMENTS

| | | | |
|---|---|---|---|
| 9,419,411 B2 * | 8/2016 | Taguchi | H01S 5/04256 |
| 9,778,428 B2 * | 10/2017 | Adachi | H01S 5/185 |
| 10,181,699 B2 * | 1/2019 | Adachi | H01S 5/02335 |
| 11,563,302 B2 * | 1/2023 | Nakanishi | H01S 5/22 |
| 2003/0042476 A1 | 3/2003 | Nakahara et al. | |
| 2005/0195876 A1 * | 9/2005 | Sato | H01S 5/0234 |
| | | | 372/87 |
| 2006/0018358 A1 | 1/2006 | Kadowaki et al. | |
| 2008/0203404 A1 * | 8/2008 | Washino | H01L 31/0224 |
| | | | 257/E31.001 |
| 2011/0193126 A1 * | 8/2011 | Oka | H01S 5/04252 |
| | | | 438/39 |
| 2012/0093190 A1 | 4/2012 | Onishi | |
| 2020/0287090 A1 * | 9/2020 | Ebisu | H01L 33/405 |
| 2021/0057884 A1 | 2/2021 | Marfeld et al. | |
| 2021/0376565 A1 * | 12/2021 | Nakanishi | H01S 5/04256 |
| 2021/0408760 A1 * | 12/2021 | Nakajima | H01S 5/22 |
| 2024/0213743 A1 * | 6/2024 | Nakahara | H01S 5/227 |

FOREIGN PATENT DOCUMENTS

| | | | |
|---|---|---|---|
| JP | 2003069153 A | 3/2003 |
| JP | 2004087866 A | 3/2004 |
| JP | 2006032819 A | 2/2006 |
| JP | 2008244414 A | 10/2008 |
| JP | 2011165869 A | 8/2011 |
| JP | 2012089622 A | 5/2012 |
| JP | 2014110365 A | 6/2014 |
| JP | 2017139319 A | 8/2017 |
| JP | 2018026468 A | 2/2018 |
| JP | 2020145391 A | 9/2020 |

* cited by examiner

RIDGE TYPE SEMICONDUCTOR OPTICAL DEVICE

CROSS-REFERENCE TO RELATED APPLICATIONS

The present application claims priority to Japanese patent applications 2021-171722 filed on Oct. 20, 2021 and 2021-196286 filed on Dec. 2, 2021, the contents of which are hereby incorporated by reference into this application.

TECHNICAL FIELD

The present disclosure relates generally to a ridge type semiconductor optical device.

BACKGROUND

A ridge type semiconductor optical device with a mesa stripe structure can be used as a light source for optical communication. The mesa stripe structure is formed by removing a pair of areas of a laminate that includes an intrinsic semiconductor layer and a multiple quantum well layer. Outside the removed pair of areas, a pair of bank structures are left to protect the mesa stripe structure. In an area between the mesa stripe structure and the bank structure, a groove is additionally formed. The groove limits an area of current flow, thus reducing a parasitic capacitance.

An upper electrode on the mesa stripe structure extends to a top of the bank structure, but its portion outside the groove does not substantially contribute to driving the light source. Further, the intrinsic semiconductor layer and the multiple quantum well layer in the bank structure increase the parasitic capacitance and prevent high-speed operation. In some cases, the electrodes are placed only on the top of the mesa stripe structure, which does not increase the parasitic capacitance, but making such electrodes is difficult because the mesa stripe structure is narrow in width (less than a few micrometers).

SUMMARY

Some implementations described herein reduce a parasitic capacitance ascribable to electrodes.

In some implementations, a ridge type semiconductor optical device includes: a laminate including an active layer or an absorption layer, the laminate having an isolation groove extending in a first direction to separate the active layer or the absorption layer, the laminate including a first region and a second region adjacent to respective both sides of the isolation groove; a mesa stripe structure adjacent to the first region on the laminate and extending in the first direction; a bank structure adjacent to the second region on the laminate and extending in the first direction; and an electrode pattern including a ridge electrode on a top and a side of the mesa stripe structure, the electrode pattern including a pad electrode on a top of the bank structure, the electrode pattern including a connection electrode connecting the ridge electrode and the pad electrode. The isolation groove has an inner surface. The inner surface includes a first wall surface adjacent to the first region, a second wall surface adjacent to the second region, and a bottom surface between the first region and the second region. The ridge electrode extends from the side of the mesa stripe structure, along a second direction orthogonal to the first direction, toward the bank structure, and not beyond the second wall surface of the isolation groove. The connection electrode is narrower in width in the first direction than any one of the ridge electrode and the pad electrode.

DETAILED DESCRIPTION

Figure 1:
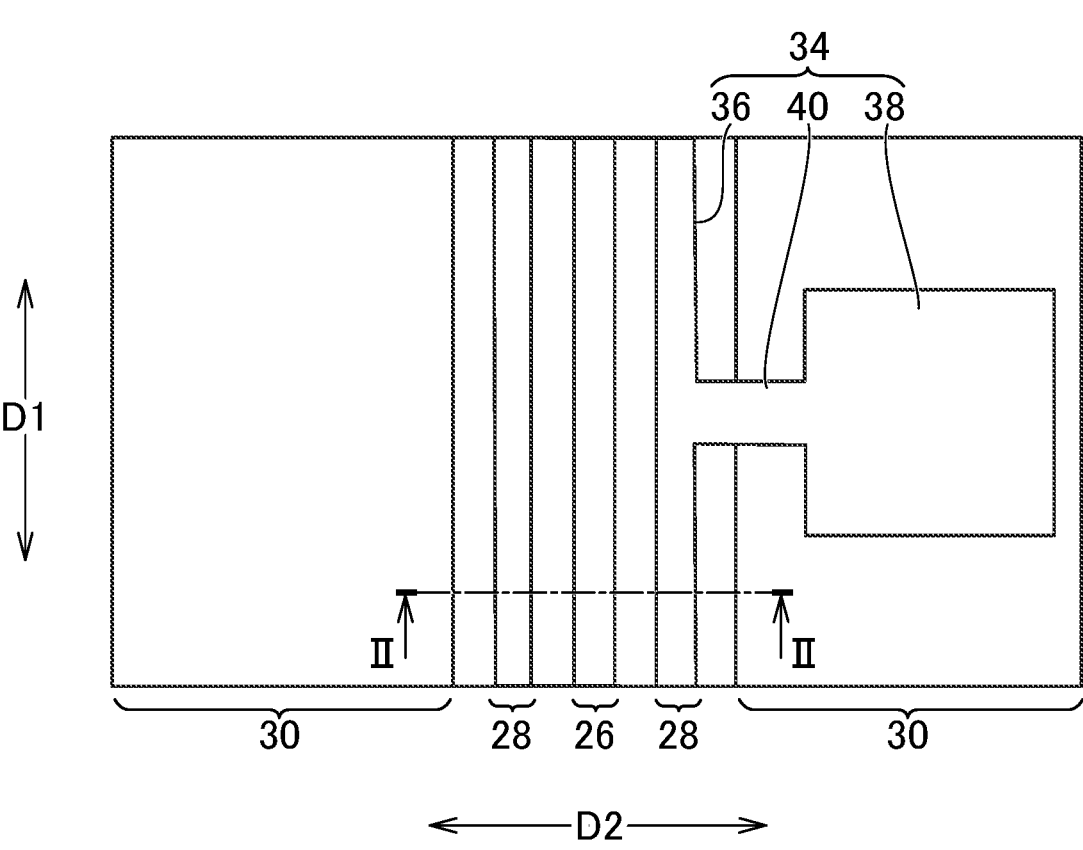
FIG. 1 is a plan view of a ridge type semiconductor optical device according to a first example implementation.

Some implementations are specifically described in detail in the following with reference to drawings. In the drawings, the same members are denoted by the same reference numerals and have the same or equivalent functions, and a repetitive description thereof may be omitted for the sake of simplicity. Note that, the drawings referred to in the following are only for illustrating the example implementations, and are not necessarily drawn to scale.

Figure 2:
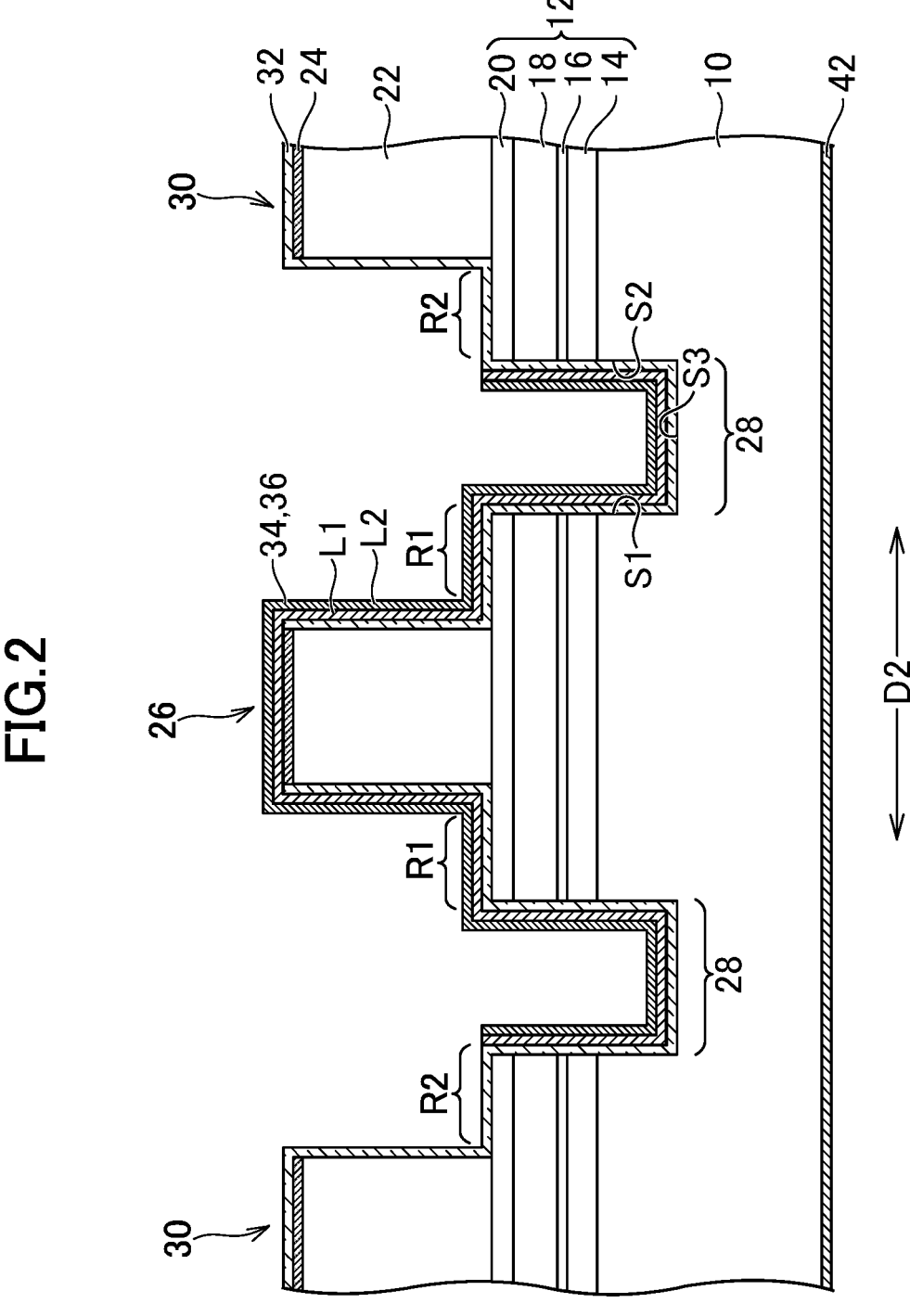
FIG. 2 is a II-II cross-sectional view of the ridge type semiconductor optical device in FIG. 1.

FIG. 1 is a plan view of a ridge type semiconductor optical device according to a first example implementation. FIG. 2 is a II-II cross-sectional view of the ridge type semiconductor optical device in FIG. 1. The ridge type semiconductor optical device may be a direct modulation type semiconductor laser in a 1.3 $\mu$m band, or may be a ridge type semiconductor optical device corresponding to another wavelength band. The ridge type semiconductor optical device is not limited to a laser, and may be an optical device with another optical function. For example, it may be a CW laser, an electro-absorption type modulator, or a photodetector.

The ridge type semiconductor optical device may have a laminate 12 on a substrate 10 comprising a semiconductor of a first conductivity type. The laminate 12 may include a buffer layer 14 of the first conductivity type, a lower separate confinement heterostructure (SCH) layer 16, an active layer 18, an upper SCH layer 20 of a second conductivity type, and may comprise a semiconductor. The laminate 12 may include the active layer 18 or an absorption layer.

Here, the first conductivity type may be n-type and the second conductivity type may be p-type, or vice versa. The substrate 10, the buffer layer 14, and a clad layer 22 may comprise InP. The lower SCH layer 16 and the upper SCH layer 20 may comprise InGaAsP. The active layer 18 may be a multiple quantum well (MQW) composed of well layers and barrier layers of InGaAsP, laminated. These materials are examples and other materials may be selected depending on a wavelength band of corresponding light and required characteristics.

The ridge type semiconductor optical device may have a mesa stripe structure 26 extending in a first direction D1. The mesa stripe structure 26 may be continuous to the laminate 12 and may include the clad layer 22 of the second conductivity type and a contact layer 24 of the second conductivity type. An unillustrated diffraction grating layer may be included between the upper SCH layer 20 and the clad layer 22.

The laminate 12 may include a first region R1. The mesa stripe structure 26 may be adjacent to the first region R1 and on the laminate 12. The first region R1 may be a pair of regions sandwiching the mesa stripe structure 26.

The laminate 12 may have an isolation groove 28. The isolation groove 28 separates the active layer 18 or the absorption layer and extends in the first direction D1. The isolation groove 28 may be formed for a purpose of preventing carriers from diffusing laterally from the active layer 18, and may have a depth exceeding the active layer 18. The isolation groove 28 may be deep enough to reach the buffer layer 14, or may be deep enough to reach the substrate 10. The first region R1 may be between the isolation groove 28 and the mesa stripe structure 26.

The laminate 12 may include a second region R2. The first region R1 and the second region R2 may be adjacent to respective both sides of the isolation groove 28. The second region R2 may be adjacent to the isolation groove 28 on a side opposite to the first region R1. The isolation groove 28 may be a pair of isolation grooves 28. The second region R2 may be a pair of second regions R2 adjacent to the respective pair of isolation grooves 28. The pair of isolation grooves 28 may be adjacent to the respective pair of first regions R1.

The inner surface of the isolation groove 28 includes a first wall surface S1 adjacent to the first region R1, a second wall surface S2 adjacent to the second region R2, and a bottom surface S3 between the first region R1 and the second region R2. The isolation groove 28 may be not limited to a rectangle in a cross section and may have another shape (e.g., U-shape, or round shape).

The ridge type semiconductor optical device may have a bank structure 30 extending in the first direction D1. The bank structure 30 may have the clad layer 22 and the contact layer 24 just like the mesa stripe structure 26. The mesa stripe structure 26, the isolation groove 28, and the bank structure 30 may extend in the first direction D1 from an end face to an opposite end face. The bank structure 30 may be adjacent to the second region R2 and on the laminate 12. The bank structure 30 may be a pair of bank structures 30 adjacent to the respective pair of second regions R2.

The ridge type semiconductor optical device may have, on its surface, a passivation film 32, which may be an insulating film, to protect the semiconductor layer from an external environment. The passivation film 32 may extend from a top of the bank structure 30 to an inner surface of the isolation groove 28 and a side of the mesa stripe structure 26.

The ridge type semiconductor optical device may have an electrode pattern 34. The electrode pattern 34 may have a lamination structure of a lower layer comprising Ti/Pt and an upper layer comprising Au. The passivation film 32 may be interposed between the laminate 12 and the electrode pattern 34 except for at least part of a top of the mesa stripe structure 26.

The electrode pattern 34 may include a ridge electrode 36. The passivation film 32 may not be formed on the top of the mesa stripe structure 26, constituting a through hole for connection between the ridge electrode 36 and the contact layer 24. The ridge electrode 36 may be composed of multiple layers including a first layer L1 and a second layer L2, laminated. The first layer L1 and the second layer L2 may have edges that need not be aligned and may be differently positioned as necessary.

The ridge electrode 36 may be on the top and the side of the mesa stripe structure 26. The ridge electrode 36 may extend from the side of the mesa stripe structure 26 toward the bank structure 30. The ridge electrode 36 may extend along a second direction D2 orthogonal to the first direction D1. The entire ridge electrode 36 may be even in width in the first direction D1.

The ridge electrode 36 may have a portion on the first wall surface S1 of the isolation groove 28, another portion on the second wall surface S2, and still another portion on the bottom surface S3. The ridge electrode 36 may not exceed the second wall surface S2 of the isolation groove 28.

The electrode pattern 34 may include a pad electrode 38 on the top of the bank structure 30. The pad electrode 38 may be used for external electrical connection, so an unillustrated wire may be bonded thereto, or it may be bonded with solder.

The electrode pattern 34 may include a connection electrode 40. The connection electrode 40 may connect the ridge electrode 36 and the pad electrode 38. The connection electrode 40 may be narrower in width in the first direction D1 than any one of the ridge electrode 36 and the pad electrode 38.

The back electrode 42 may be widely disposed on the back of the substrate 10. By injecting a current between the ridge electrode 36 and the back electrode 42, light emission may be generated in the active layer 18 and light may be emitted from the end face. The back electrode 42 need not be disposed on the back of the substrate 10. For example, a groove (not shown) extending to the buffer layer 14 or the substrate 10 may be formed at part of the bank structure 30, and an electrode (not shown) may be disposed to be connected thereto. In this case, the back electrode 42 may be disposed on the same side as the electrode pattern 34.

The ridge electrode 36 may be large in area, being excellent in terms of heat dissipation but disadvantageous in terms of a parasitic capacitance. In particular, since the active layer 18 may be separated by the isolation groove 28, the laminate 12 from the isolation groove 28 to the bank structure 30 does not contribute to light emission. However, there may be a p-i-n structure under the electrode pattern 34 disposed in these areas, therefore generating a capacitance component. For example, the insulating passivation film 32 may be disposed under a bottom of the isolation groove 28 to form the capacitance component. Outside the isolation groove 28, the active layer 18, which may be an intrinsic semiconductor layer, may be disposed in addition to the passivation film 32, also forming the capacitive component.

In the present example implementation, the ridge electrode 36 may not exceed the second wall surface S2 of the isolation groove 28, and the connection electrode 40 may be narrower in the width in the first direction D1 than any one of the ridge electrode 36 and the pad electrode 38, therefore preventing an increase in a parasitic capacitance. This enables providing the semiconductor optical device with excellent high-speed responsiveness.

In a manufacturing method for the ridge type semiconductor optical device, a multilayer film including a laminate 12 may be formed on the substrate 10 by performing crystal growth using metal organic chemical vapor deposition (MOCVD) or molecular beam epitaxy (MBE). Next, a mask may be formed using photolithography technology, and an isolation groove 28 may be formed by etching. The mesa stripe structure 26 and the bank structure may be formed by this process. After forming the passivation film 32 on an entire surface, the passivation film 32 may be removed only from an area in contact with the contact layer 24.

An electrode film may be formed on the entire surface, using a metal deposition apparatus. Next, an area to be the electrode pattern 34 may be masked, and the electrode film in other areas may be removed. By this process, the electrode pattern 34 may be formed. Finally, the back electrode 42 may be formed on the back of the substrate 10. After the above wafer processes may be completed, the substrate 10 may be separated by cleaving or etching, and the ridge type semiconductor optical device may be completed.

Figure 3:
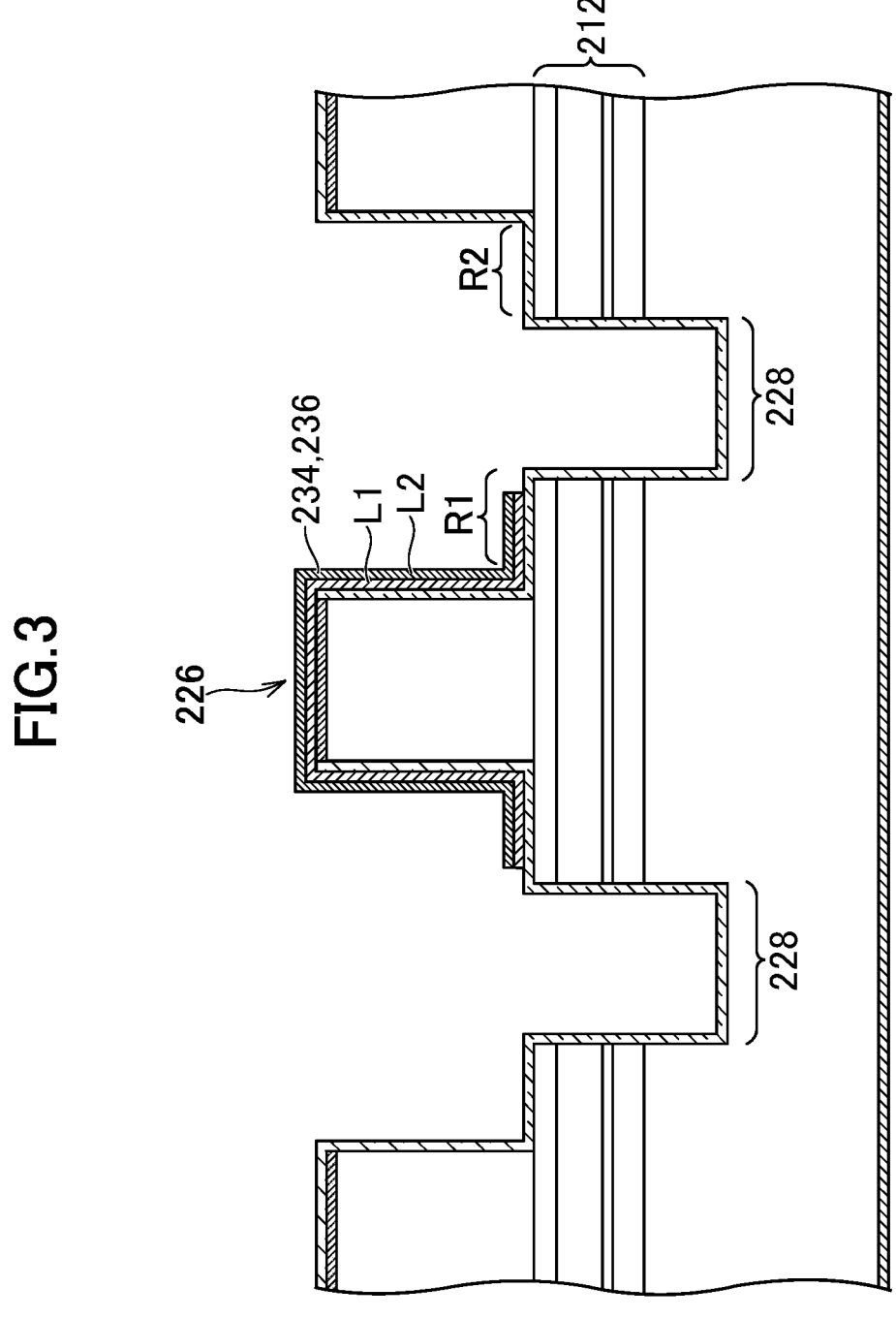
FIG. 3 is a cross-sectional view of a ridge type semiconductor optical device according to a second example implementation.

FIG. 3 is a cross-sectional view of a ridge type semiconductor optical device according to a second example implementation. This example implementation differs from the first example implementation in a shape of the electrode pattern 234.

The parasitic capacitance may be reduced if the ridge electrode 236 is only on the top of the mesa stripe structure 226. However, the mesa stripe structure 226 has a width of several micrometers (e.g., 1.7 µm here), and the first region R1 has a width of 5 µm.

In the method for forming the ridge electrode 236, after depositing the electrode film on the entire surface, the area where the ridge electrode 236 remains may be masked, and other areas may be removed. The accuracy of the mask alignment may be several micrometers. Therefore, even if an attempt may be made to mask only the top of the mesa stripe structure 226, the mask may be formed out of alignment with the top of the mesa stripe structure 226. If the mask is displaced, the position of the ridge electrode 236 may be displaced. In the worst scenario, the ridge electrode 236 may not be formed on the top of the mesa stripe structure 226 at all.

Accordingly, in the present example implementation, the ridge electrode 236 may spread over the first region R1 but does not reach the inner surface of the isolation groove 228. The width of the first region R1 may be 5 µm, and the width of both the first region R1 and the mesa stripe structure 226 may be 11.7 µm. The width of the ridge electrode 236 can be determined within this area by taking into account the mask alignment accuracy, whereby the ridge electrode 236 can be definitely formed on the top of the mesa stripe structure 226. The laminate 212 contributes to actual light emission under the mesa stripe structure 226 and under the first region R1 on both sides thereof.

This example implementation may be superior to the first example implementation in terms of the parasitic capacitance, achieving both a reduction in the parasitic capacitance and ease of manufacturing. The edges of the first layer L1 and the second layer L2 need not be aligned and may be out of alignment as necessary.

Figure 4:
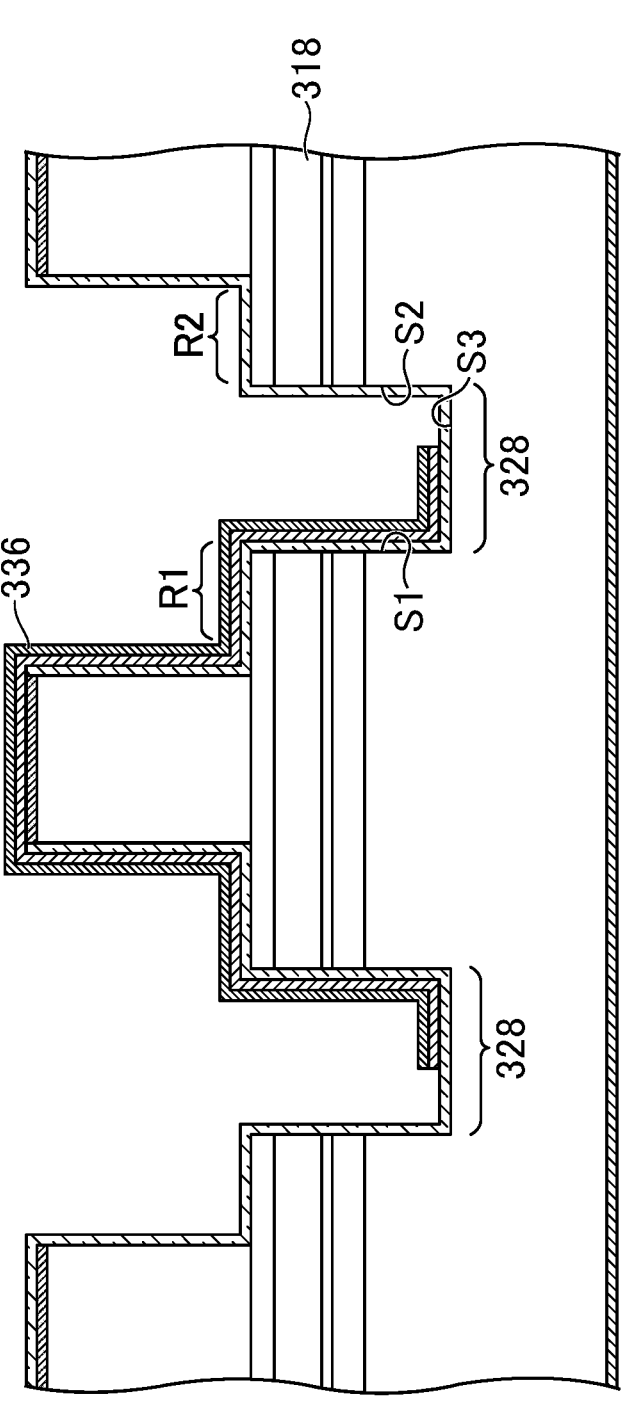
FIG. 4 is a cross-sectional view of a ridge type semiconductor optical device according to a third example implementation.

FIG. 4 is a cross-sectional view of a ridge type semiconductor optical device according to a third example implementation. The ridge electrode 336 has portions on the first wall surface S1 and the bottom surface S3 of the isolation groove 328 but no portion on the second wall surface S2.

In the first example implementation, the ridge electrode 36 extends to the second wall surface S2 of the isolation groove 28, therefore having a large parasitic capacitance, but being superior in terms of heat dissipation. The second example implementation may be superior to the first example implementation in terms of the parasitic capacitance, but inferior in terms of the heat dissipation.

The present example implementation may be in the middle of them. In particular, since the amount of heat generation may be greatest in the active layer 318, a heat radiation path can be secured due to the ridge electrode 336 covering the side of the active layer 318, therefore achieving an effect greater than an increase in the amount of the heat radiation by simply increasing the area of the ridge electrode 336.

A high-speed response may be an important characteristic for the ridge type semiconductor optical device, but at the same time, an optical output intensity may be also an important characteristic. Increasing the amount of heat dissipation leads to an increase in the optical output intensity. Therefore, by arranging the edge of the ridge electrode 336 depending on required characteristics, both the high-speed response and the ease of manufacturing can be achieved.

Figure 5:
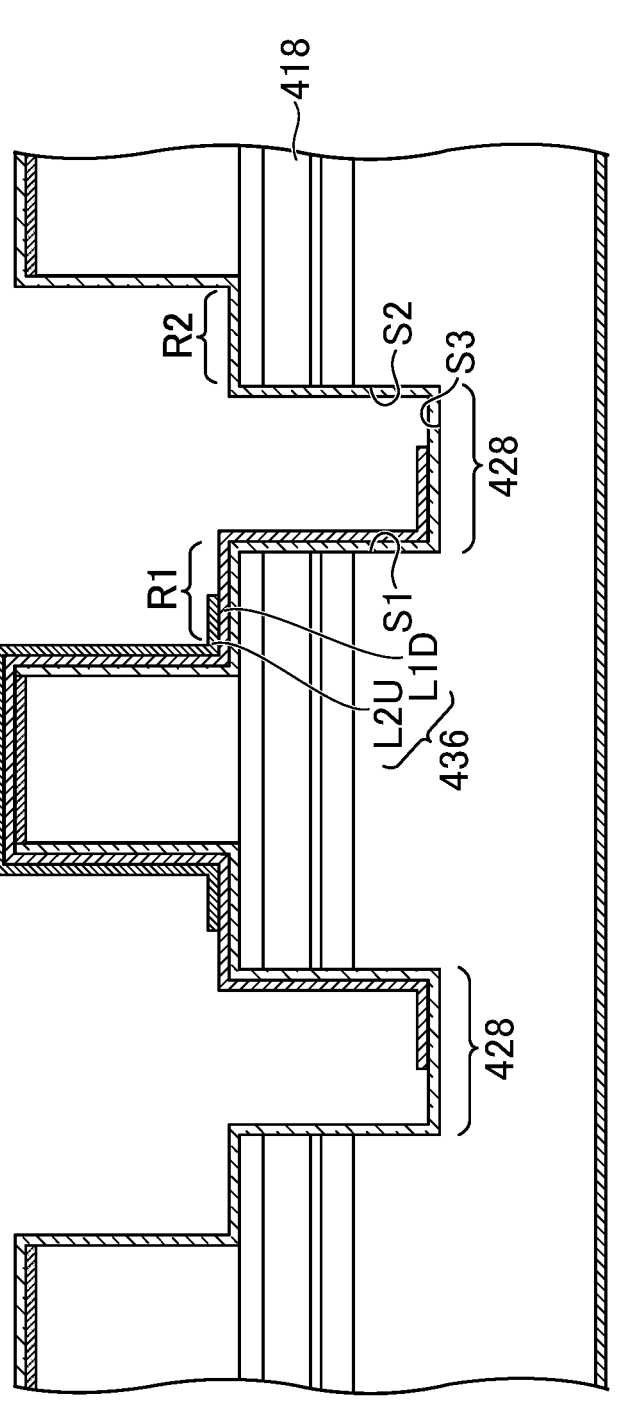
FIG. 5 is a cross-sectional view of a ridge type semiconductor optical device according to a fourth example implementation.

FIG. 5 is a cross-sectional view of a ridge type semiconductor optical device according to a fourth example implementation. The ridge electrode 436 has portions on the first wall surface S1 and the bottom surface S3 of the isolation groove 428, but has no portion on the second wall surface S2 of the isolation groove 428.

The ridge electrode 436 may be composed of multiple layers including a first layer L1D and a second layer L2U, laminated. The first layer L1D may be a lower layer and the second layer L2U may be an upper layer. The second layer L2U may overlap with only part of the first layer L1D. The first layer L1D may have a portion on the inner surface of the isolation groove 428. The second layer L2U may have no portion on the inner surface of the isolation groove 428.

The second layer L2U may comprise Au. The second layer L2U may be an outermost layer of the ridge electrode 436 and may be thicker than any other layers for external connection, therefore applying a larger stress on the semiconductor layer. The active layer 418 may be particularly susceptible to the effects on reliability and characteristics due to the stress. Therefore, the second layer L2U may not be on the side of the active layer 418, leading to reduction of the stress in the active layer 418. In terms of the parasitic capacitance, this example implementation may be equivalent to the third example implementation.

Figure 6:
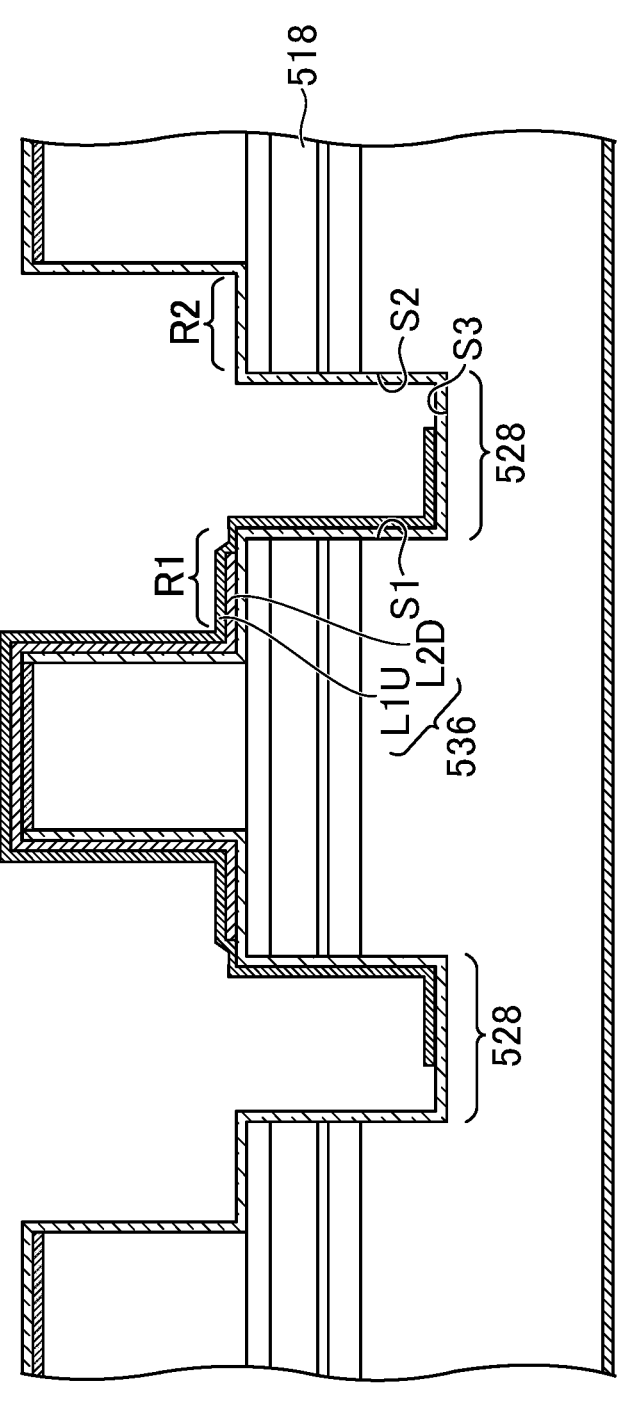
FIG. 6 is a cross-sectional view of a ridge type semiconductor optical device according to a fifth example implementation.

FIG. 6 may be a cross-sectional view of a ridge type semiconductor optical device according to a fifth example implementation. The ridge electrode 536 may have portions on the first wall surface S1 and the bottom surface S3 of the isolation groove 528, but may have no portion on the second wall surface S2.

The ridge electrode 536 may be composed of multiple layers including the first layer L1U and the second layer L2D. The first layer L1U may be the upper layer and the second layer L2D may be the lower layer. The second layer L2D may overlap with only part of the first layer L1U. The first layer L1U may have a portion on the inner surface of the isolation groove 528. The second layer L2D may have no portion on the inner surface of the isolation groove 528.

The second layer L2D may have an edge in the first region R1, and the first layer L1U edge may have an edge on the inner surface of the isolation groove 528. In terms of the stress, the thick first layer L1U comprising Au should not be on the side of the active layer 518. However, from the viewpoint of the heat dissipation, the thick first layer L1U comprising Au may be superior to the thin second layer L2D comprising Ti/Pt. Therefore, this example implementation may be superior to the fourth example implementation in terms of the heat dissipation. In addition, since the second layer L2D also can be a cause of the stress, this example implementation may be also superior to the third example implementation in terms of the stress.

In a first implementation, a ridge type semiconductor optical device includes: a laminate 12 including an active layer 18 or an absorption layer, the laminate 12 having an isolation groove 28 extending in a first direction D1 to separate the active layer 18 or the absorption layer, the laminate 12 including a first region R1 and a second region R2 adjacent to respective both sides of the isolation groove 28; a mesa stripe structure 26 adjacent to the first region R1 on the laminate 12 and extending in the first direction D1; a bank structure 30 adjacent to the second region R2 on the laminate 12 and extending in the first direction D1; and an electrode pattern 34 including a ridge electrode 36 on a top and a side of the mesa stripe structure 26, the electrode pattern 34 including a pad electrode 38 on a top of the bank structure 30, the electrode pattern 34 including a connection electrode 40 connecting the ridge electrode 36 and the pad electrode 38, the isolation groove 28 having an inner surface, the inner surface including a first wall surface S1 adjacent to the first region R1, a second wall surface S2 adjacent to the second region R2, and a bottom surface S3 between the first region R1 and the second region R2, the ridge electrode 36 extending from the side of the mesa stripe structure 26, along a second direction D2 orthogonal to the first direction D1, toward the bank structure 30, and not beyond the second wall surface S2 of the isolation groove 28, the connection electrode 40 being narrower in width in the first direction D1 than any one of the ridge electrode 36 and the pad electrode 38.

The ridge electrode 36 does not exceed the second wall surface S2 of the isolation groove 28, and the connection electrode 40 is thinner in width in the first direction D1, therefore preventing an increase in a parasitic capacitance.

In a second implementation, alone or in combination with the first implementation, the ridge electrode 236 extends over the first region R1 not to reach the inner surface of the isolation groove 228.

In a third implementation, alone or in combination with one or more of the first and second implementations, the ridge electrode 36 has a portion on the first wall surface S1 of the isolation groove 28.

In a fourth implementation, alone or in combination with one or more of the first through third implementations, the ridge electrode 36 has another portion on the bottom surface S3 of the isolation groove 28.

In a fifth implementation, alone or in combination with one or more of the first through fourth implementations, the ridge electrode 36 has still another portion on the second wall surface S2 of the isolation groove 28.

In a sixth implementation, alone or in combination with one or more of the first through fifth implementations, the ridge electrode 336 has no portion on the second wall surface S2 of the isolation groove 328.

In a seventh implementation, alone or in combination with one or more of the first through sixth implementations, the ridge electrode 36 is composed of multiple layers including a first layer L1 and a second layer L2, laminated.

In an eighth implementation, alone or in combination with one or more of the first through seventh implementations, the second layer L2U overlaps with only part of the first layer LID.

In a ninth implementation, alone or in combination with one or more of the first through eighth implementations, the first layer L1D has a portion on the inner surface of the isolation groove 28, and the second layer L2U has no portion on the inner surface of the isolation groove 28.

In a tenth implementation, alone or in combination with one or more of the first through ninth implementations, the first layer L1D is a lower layer and the second layer L2U is an upper layer.

In an eleventh implementation, alone or in combination with one or more of the first through tenth implementations, wherein the first layer L1U is an upper layer and the second layer L2D is a lower layer.

In an twelfth implementation, alone or in combination with one or more of the first through eleventh implementations, the ridge type semiconductor optical device includes a passivation film 32 interposed between the laminate 12 and the electrode pattern 34 except for at least part of the top of the mesa stripe structure 26.

In a thirteenth implementation, alone or in combination with one or more of the first through twelfth implementations, the ridge type semiconductor optical device according to any one of (1) to (12), wherein the entire ridge electrode 36 is even in the width in the first direction D1.

In a fourteenth implementation, alone or in combination with one or more of the first through thirteenth implementations, the ridge type semiconductor optical device according to any one of (1) to (13), wherein the first region R1 is a pair of first regions R1 sandwiching the mesa stripe structure 26, the isolation groove 28 is a pair of isolation grooves 28 adjacent to the respective pair of first regions R1, the second region R2 is a pair of second regions R2 adjacent to the respective pair of isolation grooves 28, and the bank structure 30 is a pair of bank structures 30 adjacent to the respective pair of second regions R2.

The example implementations described above are not limited and different variations are possible. The structures explained in the example implementations may be replaced with substantially the same structures and other structures that can achieve the same effect or the same objective.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A ridge type semiconductor optical device comprising:
a mesa stripe structure extending in a first direction;
a laminate including:
an active layer or an absorption layer,
a first isolation groove extending in the first direction to separate the active layer or the absorption layer,
a first planar region adjacent to a first side of the first isolation groove and adjacent to a first side of the mesa stripe structure,
a second planar region adjacent to a second side of the first isolation groove,
wherein the first isolation groove has a first wall surface adjacent to the first planar region, a second wall surface adjacent to the second planar region, and
a bottom surface between the first wall surface and the second wall surface,
a second isolation groove,
a third planar region adjacent to a second side of the mesa stripe structure and adjacent to a first side of the second isolation groove, and
a fourth planar region adjacent to a second side of the second isolation groove,
wherein the second isolation groove has a third wall surface adjacent to the third planar region, a fourth wall surface adjacent to the fourth planar region, and a bottom surface between the third wall surface and the fourth wall surface;
a bank structure adjacent to the second planar region and extending in the first direction; and
an electrode pattern including:
a ridge electrode on a top of the mesa stripe structure, on the first side of the mesa stripe structure, and on the second side of the mesa stripe structure,
a pad electrode on a top of the bank structure, and
a connection electrode connecting the ridge electrode and the pad electrode,
wherein the ridge electrode, on the first side of the mesa stripe structure, extends from the first side of the mesa stripe structure, along a second direction orthogonal to the first direction, toward the bank structure, and not beyond the second wall surface,
wherein the ridge electrode, on the second side of the mesa stripe structure, extends from the second side of the mesa stripe structure on the third planar region along a third direction opposite to the second direction,
wherein at least a portion of the ridge electrode, on the second side of the mesa stripe structure, extends on to the third wall surface, wherein the electrode pattern, on the second side of the mesa stripe structure, does not extend beyond the fourth wall surface, and
wherein the connection electrode has a width in the first direction that is less than a width of the ridge electrode and a width of the pad electrode.

2. The ridge type semiconductor optical device of claim 1, wherein the ridge electrode, on the first side of the mesa stripe structure, extends over the first planar region and does not extend on to the first wall surface.

3. The ridge type semiconductor optical device of claim 1, wherein the ridge electrode, on the first side of the mesa stripe structure, has a portion on the first wall surface.

4. The ridge type semiconductor optical device of claim 3, wherein the portion is a first portion; and
wherein the ridge electrode, on the first side of the mesa stripe structure, has a second portion on the bottom surface of the first isolation groove.

5. The ridge type semiconductor optical device of claim 4, wherein the ridge electrode, on the first side of the mesa stripe structure, has a third portion on the second wall surface.

6. The ridge type semiconductor optical device of claim 4, wherein the ridge electrode, on the first side of the mesa stripe structure, has no portion on the second wall surface.

7. The ridge type semiconductor optical device of claim 1, wherein the ridge electrode comprises multiple layers including a first laminated layer and a second laminated layer.

8. The ridge type semiconductor optical device of claim 7, wherein the second laminated layer overlaps a portion of the first laminated layer.

9. The ridge type semiconductor optical device of claim 8, wherein the first laminated layer has a portion on the first wall surface, and
the second laminated layer has no portion on the first wall surface.

10. The ridge type semiconductor optical device of claim 8, wherein the first laminated layer has a portion on the third wall surface, and
the second laminated layer has no portion on the third wall surface.

11. The ridge type semiconductor optical device of claim 7, wherein the first laminated layer is a lower layer and the second laminated layer is an upper layer.

12. The ridge type semiconductor optical device of claim 7, wherein the first laminated layer is an upper layer and the second laminated layer is a lower layer.

13. The ridge type semiconductor optical device of claim 7, wherein the second laminated layer extends past the first laminated layer.

14. The ridge type semiconductor optical device of claim 13, wherein the second laminated layer has a portion on the third wall surface, and
the first laminated layer has no portion on the third wall surface.

15. The ridge type semiconductor optical device of claim 13, wherein the second laminated layer has a portion on the bottom surface between the third wall surface and the fourth wall surface.

16. The ridge type semiconductor optical device of claim 1, further comprising a passivation film interposed between the laminate and the electrode pattern except for at least part of the top of the mesa stripe structure.

17. The ridge type semiconductor optical device of claim 1, wherein the width of the ridge electrode is constant along the first direction.

18. The ridge type semiconductor optical device of claim 1, further comprising:

another bank structure adjacent to the fourth planar region.

19. A ridge type semiconductor optical device comprising:

a mesa stripe structure extending in a first direction;

a laminate including:

an active layer or an absorption layer, a first isolation groove extending in the first direction to separate the active layer or the absorption layer, a first planar region adjacent to a first side of the first isolation groove and adjacent to a first side of the mesa stripe structure, a second planar region adjacent to a second side of the first isolation groove, wherein the first isolation groove has a first wall surface adjacent to the first planar region, a second wall surface adjacent to the second planar region, and a bottom surface between the first wall surface and the second wall surface, a second isolation groove, a third planar region adjacent to a second side of the mesa stripe structure and adjacent to a first side of the second isolation groove, and a fourth planar region adjacent to a second side of the second isolation groove, wherein the second isolation groove has a third wall surface adjacent to the third planar region, a fourth wall surface adjacent to the fourth planar region, and a bottom surface between the third wall surface and the fourth wall surface;

a bank structure adjacent to the second planar region and extending in the first direction; and an electrode pattern including:

a ridge electrode on a top of the mesa stripe structure, on the first side of the mesa stripe structure, and on the second side of the mesa stripe structure, a pad electrode on a top of the bank structure, and a connection electrode connecting the ridge electrode and the pad electrode, wherein the ridge electrode, on the first side of the mesa stripe structure, extends on to the first planar region along a second direction orthogonal to the first direction, wherein the ridge electrode, on the second side of the mesa stripe structure, extends from the second side of the mesa stripe structure on the third planar region along a third direction opposite to the second direction, wherein at least a portion of the ridge electrode, on the second side of the mesa stripe structure, extends on to the third wall surface, wherein the electrode pattern, on the second side of the mesa stripe structure, does not extend beyond the fourth wall surface, and wherein the connection electrode has a width in the first direction that is less than a width of the ridge electrode and a width of the pad electrode.

20. A ridge type semiconductor optical device comprising:

a mesa stripe structure extending in a first direction;

a laminate including:

an active layer or an absorption layer, a first isolation groove extending in the first direction to separate the active layer or the absorption layer, a first planar region adjacent to a first side of the first isolation groove and adjacent to a first side of the mesa stripe structure, a second planar region adjacent to a second side of the first isolation groove, wherein the first isolation groove has a first wall surface adjacent to the first planar region, a second wall surface adjacent to the second planar region, and a bottom surface between the first wall surface and the second wall surface, a second isolation groove, a third planar region adjacent to a second side of the mesa stripe structure and adjacent to a first side of the second isolation groove, and a fourth planar region adjacent to a second side of the second isolation groove, wherein the second isolation groove has a third wall surface adjacent to the third planar region, a fourth wall surface adjacent to the fourth planar region, and a bottom surface between the third wall surface and the fourth wall surface;

a bank structure adjacent to the second planar region and extending in the first direction; and an electrode pattern including:

a ridge electrode on a top of the mesa stripe structure, on the first side of the mesa stripe structure, and on the second side of the mesa stripe structure, a pad electrode on a top of the bank structure, and a connection electrode connecting the ridge electrode and the pad electrode, wherein the ridge electrode, on the first side of the mesa stripe structure, extends on to the first planar region along a second direction orthogonal to the first direction and on to the bottom surface of the first isolation groove, and does not extend on to the second wall surface, wherein the ridge electrode, on the second side of the mesa stripe structure, extends from the second side of the mesa stripe structure on the third planar region along a third direction opposite to the second direction, wherein at least a portion of the ridge electrode, on the second side of the mesa stripe structure, extends on to the third wall surface, wherein the electrode pattern, on the second side of the mesa stripe structure, does not extend on to the fourth wall surface, and wherein the connection electrode has a width in the first direction that is less than a width of the ridge electrode and a width of the pad electrode.

* * * * *